United States Patent [19]

Sato

[11] 4,268,603

[45] May 19, 1981

[54] PHOTORESIST COMPOSITIONS

[75] Inventor: Takayuki Sato, Yokosuka, Japan

[73] Assignee: Tokyo Ohka Kogyo Kabushiki Kaisha, Kawasaki, Japan

[21] Appl. No.: 61,306

[22] Filed: Jul. 27, 1979

[30] Foreign Application Priority Data

Dec. 7, 1978 [JP] Japan ................. 53-151842

[51] Int. Cl.$^3$ .................. G03C 1/60; G03C 1/70; G03C 1/71

[52] U.S. Cl. ..................... 430/196; 430/167; 430/197; 430/139; 430/510; 430/512

[58] Field of Search .............. 430/196, 197, 28, 325, 430/326, 141, 146, 139, 510, 512, 167

[56] References Cited

U.S. PATENT DOCUMENTS

| | | | |
|---|---|---|---|
| 2,848,328 | 8/1958 | Hepher | 430/197 |
| 3,062,650 | 11/1962 | Sagura et al. | 430/197 |
| 3,072,485 | 1/1963 | Reynolds et al. | 430/196 |
| 3,387,975 | 6/1968 | Tamara | 430/28 |
| 3,515,554 | 6/1970 | Robillard | 430/146 |
| 3,567,453 | 3/1971 | Borden | 430/196 |
| 3,628,954 | 12/1971 | Robillard | 430/156 |
| 3,778,274 | 12/1973 | Inoue et al. | 430/141 |
| 3,817,757 | 6/1974 | Yabe et al. | 430/197 |
| 3,844,793 | 10/1974 | Singh | 430/197 |
| 3,887,379 | 6/1975 | Clecak et al. | 430/197 |
| 3,923,522 | 12/1975 | Hata et al. | 430/197 |
| 4,142,898 | 3/1979 | Izu | 430/156 |

FOREIGN PATENT DOCUMENTS

51-37562 3/1976 Japan.

OTHER PUBLICATIONS

Clecak, N. et al., "Negative Photoresist", IBM Technical Disclosure Bulletin, vol. 13, No. 5, 10/1970, p. 1274.

*Primary Examiner*—Charles L. Bowers, Jr.
*Attorney, Agent, or Firm*—Brisebois & Kruger

[57] ABSTRACT

The invention presents a novel photoresist composition used in the photoetching in the manufacture of various electronic semiconductor devices, in which the phenomenon of halation adversely affecting the fidelity of the etching patterns can be very much reduced. The photoresist composition of the invention comprises (a) a cyclized rubber, (b) a bisazide compound, (c) a photoextinction agent which is a 4-phenylazo-N,N-disubstituted aniline compound or a related bis derivative of biphenyl or diphenyl ether, and (d) a fluorescent agent which is a N,N'-di(substituted methylene) derivative of a phenylenediamine or hydrazine.

With this formulation, the loss of ultraviolet absorption at about 360 nm caused by the photodecomposition of the component (b) is compensated for by the absorption of the photodecomposition product of the component (c) while the component (d) has no absorption at about 360 nm but emits a fluorescence in the range of 380 to 450 nm.

15 Claims, 3 Drawing Figures

PHOTORESIST COMPOSITIONS

BACKGROUND OF THE INVENTION

The present invention relates to a novel photoresist composition with very much reduced halation in exposure to light and capable of giving high residual film ratio with its performance retained even by a treatment at an elevated temperature.

Various kinds of electronic devices such as transistors, ICs, LSIs and the like are usually manufactured by a fine working technique utilizing a process of photoetching. The process of photoetching is typically performed by providing a layer of a photoresist composition on the surface of a wafer of silicon semiconductor, overlaying a mask of desired patterns on the layer of the photoresist composition, subjecting the layer of the photoresist composition to exposure to light through the mask followed by developing and etching to form the patterns of the photoresist composition and effecting a selective diffusion. In most cases, several times of the above process are repeated each with the step of selective diffusion whereupon electrodes and wiring connections are provided with aluminum to give the finished electronic device.

When the surface of the substrate has a high reflectivity as in aluminum or silicon in the above described procedures, difficulties are encountered in obtaining a high fidelity in the exposure of the layer of the photoresist composition to light through a mask bearing very fine patterns since the incident light is reflected irregularly by the substrate surface so that the portions of the photoresist not to be exposed to light are exposed to the irregularly reflected light. As a consequence, the line width of the patterns in the photoresist layer is broader than that of the patterns in the mask when the photoresist composition is of a negative type while, on the other hand, the former is thinner than the latter when the photoresist composition is of a positive type. This problem of low fidelity in the patterns is more serious on rugged surfaces having step-wise height difference after several times of the selective diffusion as described above.

The above problem is partly overcome by incorporating a photoextinction agent such as a dyestuff known by the trivial name of Oil Yellow which serves to reduce halation. On the other hand, conventional photoresist compositions with a cyclized rubber as the base ingredient are usually admixed with a bisazide compound such as 2,6-di(4'-azidobenzylidene)-4-methylcyclohexanone. When such a photoresist composition is exposed to ultraviolet light from an ultra-high pressure mercury lamp which emits line spectra mainly at 435 nm, 405 nm and 365 nm as the light source, the bisazide compound contained in the photoresist composition is decomposed by the ultraviolet light to form crosslinks resulting in disappearance of the original absorption at about 360 nm with consequent appearance of a new absorption at about 405 nm. Therefore, no satisfactory prevention of halation can be obtained by formulating a photoextinction agent for the light with the wavelengths of 435 nm, 405 nm and 365 nm from an ultra-high pressure mercury lamp resulting only in the decrease of the effective dose of the light.

SUMMARY OF THE INVENTION

It is therefore an object of the present invention to provide a novel photoresist composition free from the above described problems in the prior art photoresist compositions and with very much reduced halation compensating for the photodecomposition of the bisazide compound contained in the composition.

Thus the novel photoresist composition presented by the present invention comprises
(a) a cyclized rubber,
(b) a bisazide compound,
(c) a photoextinction agent which is a compound represented by the general formula

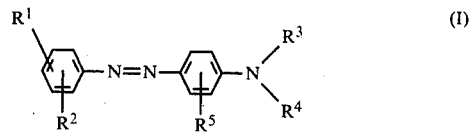

or

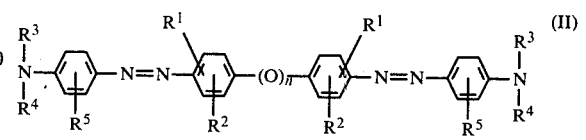

in which $R^1$ and $R^2$ are each an atom or a group selected from the class consisting of a hydrogen atom, a hydroxy group, alkyl groups and alkoxy groups, $R^3$ and $R^4$ are each a group selected from the class consisting of alkyl groups, hydroxyalkyl groups and aralkyl groups, $R^5$ is a hydrogen atom or an alkyl group and n is a number of 0 or 1, and (d) a fluorescent agent which is a compound represented by the general formula

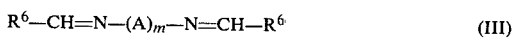

in which $R^6$ is an aryl group or a 2-arylethylenyl group, A is a phenylene group and m is a number of 0 or 1.

DETAILED DESCRIPTION OF THE PREFERRED EMBODIMENTS

The present invention as described above has been established as a result of the extensive investigations undertaken by the inventor based on his discovery that the problems in the prior art photoresist compositions can be overcome by formulating the photoresist composition containing a cyclized rubber as the base ingredient and a bisazide compound with, first, a photoextinction agent which is a compound represented by the above general formulas (I) or (II), which compound has an absorption in the wavelength region of 400 to 450 nm and is capable of giving, when irradiated with ultraviolet light, a photodecomposition product having an absorption at about 360 nm in compensation for the loss of the absorption at about 360 nm by the photodecomposition of the bisazide compound in the irradiation with ultraviolet light and, second, a fluorescent agent which is a compound represented by the general formula (III) stable in the irradiation with ultraviolet light and has an absorption at about 360 nm giving rise to a fluorescence in the wavelength region of 380 to 450 nm.

Figure 1:
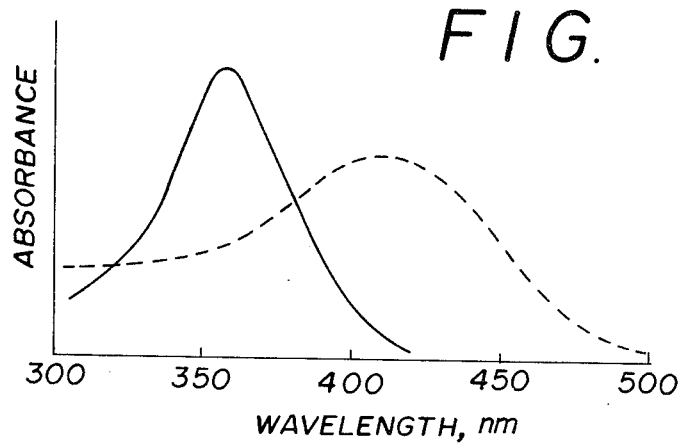
FIG. 1 shows the ultraviolet absorption spectra of 2,6-di(4'-azidobenzylidene)-4-methylcyclohexanone and the photodecomposition product thereof.
Figure 2:
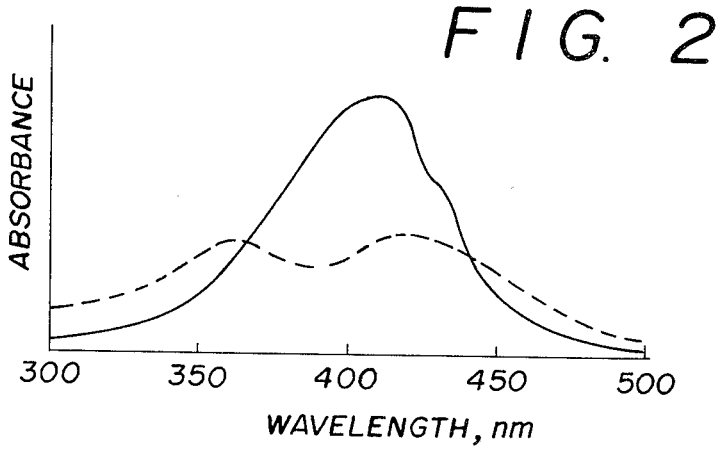
FIG. 2 shows the ultraviolet absorption spectra of N,N-dibutyl-4-phenylazoaniline and the photodecomposition product thereof.
Figure 3:
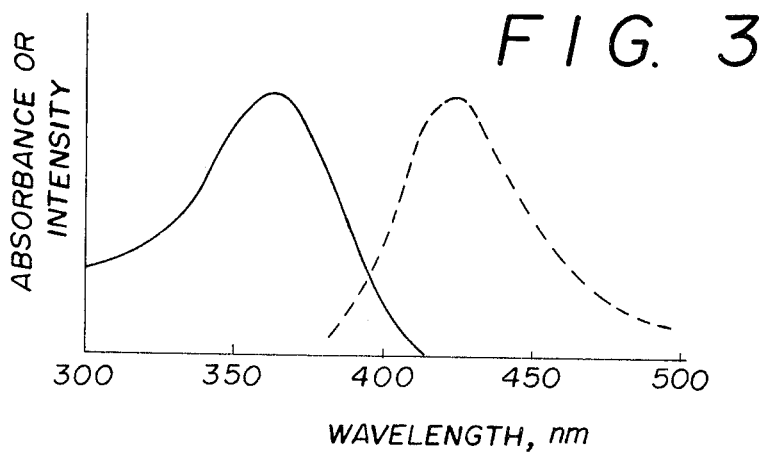
FIG. 3 shows the ultraviolet absorption spectrum of 1,4-dibenzylidene-1,4-phenylenediamine and the fluorescence spectrum of the same compound.

The above described situations in the absorption or fluorescence of the bisazide compounds, the photoextinction agents and the fluorescent agents are shown in the drawing. The solid line in FIG. 1 shows the absorption spectrum of 2,6-di(4'-azidobenzylidene)-4-methylcyclohexanone and this compound is decomposed by irradiation with ultraviolet light to give a decomposition product with an absorption spectrum shown by the broken line in the same figure showing a shift of the absorption maximum from about 360 nm to about 405 nm. On the other hand, the photoextinction agent represented by the general formulas (I) or (II) has an absorption band in the region of 400 to 450 nm but the compound is decomposed by the irradiation with ultraviolet light to give a decomposition product with an absorption at about 370 nm as are shown by the solid line and broken line in FIG. 2 taken with N,N-dibutyl-4-phenylazoaniline as an example before and after irradiation with ultraviolet light, respectively. Further, 1,4-dibenzylidene-1,4-phenylenediamine as a typical example of the fluorescent agent in the inventive composition absorbs the ultraviolet light of the wavelength 340 to 380 nm as is shown by the solid line in FIG. 3 and emits a fluorescent light in the wavelength region of 380 to 450 nm as is shown by the broken line in the same figure.

The component (a) as the base ingredient in the inventive photoresist compositions is a cyclized rubber conventionally used in the prior art photoresist compositions including cyclized polyisoprenes, cyclized polyisobutylenes, cyclized polybutadienes and the like.

The bisazide compound as the component (b) in the inventive compositions serves as a crosslinking agent as exemplified by those compounds disclosed in U.S. Pat. No. 2,940,853 such as 4,4'-diazidochalcone, 4,4'-diazidodiphenyl, 4,4'-diazidostilbene, 2,6-bis(4'-azidobenzal)cyclohexanone, 2,6-bis(4'-azidobenzal)-3-methylcyclohexanone, 2,6-bis(4'-azidobenzal)-4-methylcyclohexanone and the like. These bisazide compounds are contained in some of commercially available products of conventional photoresist compositions with a cyclized rubber as the base ingredient and such prior art compositions commercially available with various trade names can be used as such. The amount of the bisazide compound in the inventive composition is in the range from 1 to 10% by weight or, preferably, from 3 to 5% by weight based on the cyclized rubber.

The photoextinction agent as the component (c) in the inventive compositions is a compound represented by the above general formula (I) or (II), in which $R^1$ and $R^2$ are each an atom or a group selected from the class consisting of a hydrogen atom, a hydroxy group, alkyl groups having 1 to 4 carbon atoms such as methyl, ethyl, propyl, and butyl groups, and alkoxy groups having 1 to 5 carbon atoms such as methoxy, ethoxy, propoxy, butoxy and pentoxy groups; $R^3$ and $R^4$ are each a group selected from the class consisting of alkyl groups having 1 to 4 carbon atoms such as methyl, ethyl, propyl and butyl groups, hydroxyalkyl groups having 1 to 3 carbon atoms such as hydroxymethyl, hydroxyethyl and hydroxypropyl groups and aralkyl groups such as benzyl group; and $R^5$ is a hydrogen atom or an alkyl group having 1 to 2 carbon atoms such as methyl and ethyl groups.

The 4-phenylazoaniline compounds which are in conformity with the general formula (I) are exemplified by N,N-diethyl-4-phenylazoaniline, N,N-dibutyl-4-phenylazoaniline, N-ethyl-N-benzyl-4-phenylazoaniline, N,N-diethyl-4-(4'-ethoxyphenylazo)aniline, N,N-dibutyl-4-(4'-ethoxyphenylazo)aniline, N-ethyl-N-hydroxyethyl-4-phenylazoaniline, N,N-diethyl-4-(4'-n-pentoxyphenylazo)aniline, N,N-diethyl-4-(2'-methoxy-4'-n-propylphenylazo)aniline, N,N-dimethyl-4-(4'-hydroxyphenylazo)aniline, N,N-diethyl-2-methyl-4-(4'-hydroxyphenylazo)aniline and the like.

The compounds in conformity with the general formula (II) are derivatives of biphenyl or derivatives of diphenyl ether according to the values of n equal to 0 or 1, respectively, and exemplified by 4,4'-bis(p-dimethylaminophenylazo)diphenyl ether, 4,4'-bis(p-dimethylaminophenylazo)biphenyl, 4,4'-bis(p-diethylaminophenylazo)biphenyl, 4,4'-bis(p-dimethylaminophenylazo)-3,3'-dimethoxybiphenyl and the like.

All of the above named compounds of the general formulas (I) or (II) have an absorption band in the region from 400 to 450 nm and are decomposed by the irradiation with ultraviolet light to produce a decomposition product having an absorption band in the region of about 360 nm. Furthermore, advantages are obtained with these compounds in the absence of sublimation even by heating at an elevated temperature of, say, 100° C. or higher different from conventional photoextinction agents and also in the good solubility in organic solvents as well as the excellent compatibility with the cyclized rubber as the base ingredient.

The component (c), i.e. the compound represented by the general formulas (I) or (II), is formulated in the inventive photoresist compositions in an amount from 0.5 to 15% or, preferably, from 1 to 5% by weight based on the amount of the cyclized rubber as the component (a). When the amount is smaller than above, the halation preventing effect is insufficient while larger amounts than above are undesirable due to the possible precipitation of the compound in the films of the photoresist composition to form a heterogeneous phase.

The fluorescent agent as the component (d) in the inventive photoresist composition is a compound represented by the above given general formula (III), in which $R^6$ is an aryl group such as phenyl and naphthyl groups or a 2-arylethylenyl group such as styryl group, A is a 1,4-phenylene or a 1,3-phenylene group and m is a number of 0 or 1. Thus, the compound is a derivative of hydrazine or phenylenediamine according to the value of m of 0 or 1, respectively.

The compounds in conformity with the general formula (III) and the definitions of the symbols above given are exemplified by N,N'-dibenzylidene-1,4-phenylenediamine, N,N'-dibenzylidene-1,3-phenylenediamine, N,N'-bis(1-naphthylmethylene)-1,4-phenylenediamine, N,N'-bis(1-naphthylmethylene)-1,3-phenylenediamine, N,N'-dicinnamylidene-1,3-phenylenediamine, N,N'-bis(1-naphthylmethylene)hydrazine and the like.

These compounds are stable against irradiation with ultraviolet light and absorb the light with a wavelength of 340 to 380 nm emitting a fluorescence in the wavelength region of 380 to 450 nm. The component (d), i.e. the fluorescent agent, is formulated in the inventive photoresist composition in an amount from 0.5 to 15% by weight or, preferably, from 1 to 8% by weight based on the amount of the cyclized rubber. When the amount is smaller than above, the effect of preventing the undesirable halation caused by the irregular reflexion is insufficient while larger amounts than above are undesirable due to the possible precipitation of the compound in the photoresist composition when applied on the substrate surface.

It is another requirement that the photoextinction agent represented by the general formula (I) or (II) and the fluorescent agent represented by the general formula (III) are formulated as combined in a weight proportion of 1:5 to 5:1 in order to obtain an excellent halation preventing effect without decreasing the residual film ratio after development.

The photoresist composition of the present invention can be obtained by merely blending the components (a) to (d) with the addition of a suitable organic solvent such as benzene, toluene, xylene and the like to give an appropriate viscosity or consistency suitable for application on to the surfaces of a substrate. Thus, 100 parts by weight of the cyclized rubber as the component (a) and 1 to 10 parts by weight of the bisazide compound as the component (b) are dissolved in the organic solvent to form a uniform solution and thereafter 0.5 to 15 parts by weight of the photoextinction agent as the component (c) represented by the general formula (I) or (II) above and 0.5 to 15 parts by weight of the fluorescent agent as the component (d) represented by the above general formula (III) are admixed and dissolved in the solution.

The thus obtained photoresist composition of the invention can be applied on to the surface of a substrate by a suitable means such as a spinner and dried to form a film of the photoresist composition. The thickness of the photoresist film is preferably in the range from 0.5 to 1.0 $\mu$m as dried. The photoresist film thus formed after drying is overlaid with a mask or transparency bearing a desired pattern and exposed to the ultraviolet light by use of a suitable light source such as an ultra-high pressure mercury lamp, arc lamp and the like through the mask or transparency pattern-wise followed by development with an organic solvent which is the same kind as the solvent used for the preparation of the composition to remove the uncured photoresist composition on the unexposed areas leaving the pattern-wise cured layer of the composition with subsequent baking at a temperature of 100° to 200° C. to complete the curing of the composition. Thereafter, etching is performed with a suitable etching solution such as a phosphoric acid solution to give an electronic device with image lines of high fidelity.

With the photoresist composition of the present invention, high-precision etching can be performed with a fidelity of the etched pattern hitherto impossible with the conventional photoresist compositions. In addition, the wide latitude of the inventive photoresist composition permits a simplification of the process control contributing to the improvement of the productivity as well as to the mass production of electronic devices with very uniform quality. Moreover, an additional advantage is obtained that a projection type mask aligner can be used owing to the absence of photosensitivity decreasing effect caused by the addition of a photoextinction agent so that the inventive photoresist composition can be applied even to a field where an ultra-fine working is necessitated.

In the following, examples of the present invention are described in order to illustrate the present invention in further detail.

In the examples, parts are all expressed by parts by weight.

EXAMPLE 1

A base composition was prepared by dissolving 100 parts of a cyclized polyisoprene and 3 parts of 2,6-di(4-azidobenzal)-4-methylcyclohexanone in 900 parts of xylene and then 3 parts of N,N-dibutyl-4-phenylazoaniline and 5 parts of N,N'-dibenzylidene-1,4-phenylenediamine were admixed to the base composition to give a photoresist composition.

The thus prepared photoresist composition was applied by use of a spinner on to the surface of a silicon wafer with a deposited layer of aluminum in a thickness of about 0.8 $\mu$m as dried followed by drying at 80° to 90° C. for 20 minutes. The silicon wafer provided with the dried layer of the photoresist composition was exposed to ultraviolet light from a 200 watt ultra-high pressure mercury lamp through a chromium mask with a test chart for resolving power in a varied length of time with an irradiation intensity of 160 $\mu$W/cm$^2$/second followed by developing with xylene, post-baking at 150° to 160° C. for 30 minutes and etching with phosphoric acid.

The exposure time with which a residual film ratio of at least 90% was obtained without bridging ranged from 2 to 10 seconds.

For comparison, the same test procedures as above were repeated with the base composition as such in place of the above prepared photoresist composition to give a result that the exposure time must be controlled within a very narrow range of 1.5 to 2.0 seconds.

EXAMPLE 2

Photoresist compositions were prepared by use of a base composition composed of 100 parts of the cyclized polyisoprene, 3 parts (Experiments No.1 to No.10) or 4 parts (Experiments No.11 to No.20) of 2,6-di(4-azidobenzal)-4-methylcyclohexanone and 900 parts of xylene which was admixed with or without the photoextinction agent which was admixed with a photoextinction agent selected from the compounds (I) to (V) listed below and/or a fluorescent agent selected from the compounds (VI) to (IX) listed below. The amounts of these photoextinction agent and fluorescent agent in parts are given in Table 1 below.

(I) N,N-diethyl-4-(4'-ethoxyphenylazo)aniline
(II) N,N-diethyl-4-(4'-n-pentoxyphenylazo)aniline
(III) N,N-diethyl-4-(2'-methoxy-4'-propylphenylazo)aniline
(IV) 4,4'-bis(p-dimethylaminophenylazo)diphenyl ether
(V) 4,4'-bis(p-dimethylaminophenylazo)-3,3'-dimethoxybiphenyl
(VI) N,N'-dibenzylidene-1,4-phenylenediamine
(VII) N,N'-dibenzylidene-1,3-phenylenediamine
(VIII) N,N'-bis(1-naphthylmethylene)-1,4-phenylenediamine
(IX) N,N'-bis(1-naphthylmethylene)hydrazine The test of photoetching was performed in the same manner as in Example 1 with the above prepared photoresist compositions to form an etched pattern of 3 $\mu$m line width on an aluminum-deposited silicon wafer with varied exposure times to find the minimum exposure time $t_1$ giving no meandering of the pattern lines due to swelling in developing and the maximum exposure time $t_2$ giving no short circuit between the aluminum wirings. The results are set out in Table 1. Table 1 also includes the results for the percentages of short-circuit-

TABLE 1

| Exp. No. | Photoextinction agent, parts | | Fluorescent agent, parts | | $t_1$, sec. | $t_2$, sec | Percentage of short-circuiting, % | | | | | |
|---|---|---|---|---|---|---|---|---|---|---|---|---|
| | | | | | | | 2 sec. | 4 sec. | 6 sec. | 8 sec. | 10 sec. | 12 sec. |
| 1 | — | | — | | 1.5 | 2 | 0 | 60 | 100 | 100 | 100 | 100 |
| 2 | (II) | 3 | — | | 2 | 6 | 0 | 0 | 0 | 20 | 60 | 100 |
| 3* | (III) | 10 | — | | 5 | 15 | 0 | 0 | 0 | 0 | 0 | 0 |
| 4 | (IV) | 1.5 | — | | 2 | 6 | 0 | 0 | 0 | 50 | 100 | 100 |
| 5 | (V) | 3 | — | | 2 | 6 | 0 | 0 | 0 | 20 | 60 | 100 |
| 6 | — | | (VI) | 3 | 2 | 6 | 0 | 0 | 0 | 20 | 70 | 100 |
| 7 | — | | (VIII) | 3 | 2 | 6 | 0 | 0 | 0 | 30 | 80 | 100 |
| 8 | — | | (IX) | 3 | 2 | 6 | 0 | 0 | 0 | 30 | 80 | 100 |
| 9 | (I) | 3 | (IX) | 4 | 2 | 15 | 0 | 0 | 0 | 0 | 0 | 0 |
| 10 | (V) | 3 | (VI) | 3 | 2 | 15 | 0 | 0 | 0 | 0 | 0 | 0 |
| 11 | — | | — | | 1 | 2 | 0 | 90 | 100 | 100 | 100 | 100 |
| 12 | — | | (VII) | 10 | 2 | 8 | 0 | 0 | 0 | 0 | 20 | 20 |
| 13 | (I) | 3 | (VII) | 5 | 2 | 12 | 0 | 0 | 0 | 0 | 0 | 0 |
| 14 | — | | — | | 1 | 1.5 | 30 | 100 | 100 | 100 | 100 | 100 |
| 15 | (I) | 5 | — | | 2 | 8 | 0 | 0 | 0 | 0 | 20 | 50 |
| 16 | — | | (VI) | 5 | 2 | 8 | 0 | 0 | 0 | 0 | 20 | 50 |
| 17 | (I) | 3 | (VI) | 3 | 2 | 12 | 0 | 0 | 0 | 0 | 0 | 0 |
| 18 | (II) | 3 | (VIII) | 3 | 2 | 15 | 0 | 0 | 0 | 0 | 0 | 0 |
| 19 | (IV) | 2 | (VI) | 6 | 2 | 15 | 0 | 0 | 0 | 0 | 0 | 0 |
| 20 | (III) | 2 | (VI) | 3 | 2 | 15 | 0 | 0 | 0 | 0 | 0 | 0 |

*no practicability with pinholes and markedly decreased residual film ratio

What is claimed is:

1. A photoresist composition which comprises an admixture of
   (a) a cyclized rubber,
   (b) a bisazide compound as a photosensitive crosslinking agent in an amount of from 1 to 10 parts by weight per 100 parts by weight of cyclized rubber, said bisazide compound being selected from the group consisting of 4,4'-diazidochalcone, 4,4'-diazidodiphenyl, 4,4'-diazidostilbene, 2,6-bis(4'-azidobenzal)cyclohexanone, 2,6-bis(4'-axidobenzal)-3-methylcyclohexanone and 2,6-bis (4'-axidobenzal)-4-methylcyclohexanone,
   (c) 0.5 to 15 parts by weight per 100 parts by weight of the cyclized rubber of a photoextinction agent which is a compound represented by the general formula

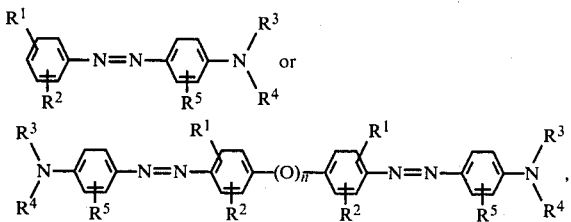

in which $R^1$ and $R^2$ are each an atom or a group selected from the class consisting of a hydrogen atom, a hydroxy group, alkyl groups and alkoxy groups, $R^3$ and $R^4$ are each a group selected from the class consisting of alkyl groups, hydroxyalkyl groups and aralkyl groups, $R^5$ is a hydrogen atom or an alkyl group and n is a number of 0 to 1, and
   (d) 0.5 to 15 parts by weight per 100 parts by weight of the cyclized rubber of a fluorescent agent which is a compound represented by the general formula $R^6$—CH=N—(A)$_m$—N=CH—$R^6$, in which $R^6$ is an aryl group or a 2-arylethylenyl group , A is a phenylene group and m is a number of 0 or 1.

2. The photoresist composition as claimed in claim 1 wherein the cylized rubber is selected from the class consisting of cyclized polyisoprenes, cyclized polyisobutylenes and cyclized polybutadienes.

3. The photoresist composition as claimed in claim 1 wherein the alkyl group represented by the symbols $R^1$ or $R^2$ has from 1 to 4 carbon atoms.

4. The photoresist composition as claimed in claim 1 wherein the alkoxy group represented by the symbols $R^1$ or $R^2$ has from 1 to 5 carbon atoms.

5. The photoresist composition as claimed in claim 1 wherein the alkyl group represented by the symbols $R^3$ or $R^4$ has from 1 to 4 carbon atoms.

6. The photoresist composition as claimed in claim 1 wherein the hydroxyalkyl group represented by the symbols $R^3$ or $R^4$ has from 1 to 3 carbon atoms.

7. The photoresist composition as claimed in claim 1 wherein the aralkyl group represented by the symbols $R^3$ or $R^4$ is a benzyl group.

8. The photoresist composition as claimed in claim 1 wherein the alkyl group represented by the symbol $R^5$ has from 1 to 2 carbon atoms.

9. The photoresist composition as claimed in claim 1 wherein the photoextinction agent as the component (c) is selected from the class consisting of carbon atoms. N,N-diethyl-4-phenylazoaniline, N,N-dibutyl-4-phenylazoaniline, N-ethyl-N-benzyl-4-phenylazoaniline, N,N-diethyl-4-(4'-ethoxyphenylazo)aniline, N,N-dibutyl-4-(4'-ethoxyphenylazo)aniline, N-ethyl-N-hydroxyethyl-4-phenylazoaniline, N,N-diethyl-4-(4'-n-pentoxyphenylazo)aniline, N,N-diethyl-4-(2'-methoxy-4'-n-propylphenylazo)aniline, N,N-dimethyl-4-(4'-hydroxyphenylazo)aniline and N,N-diethyl-2-methyl-4-(4'-hydroxyphenylazo)aniline.

10. The photoresist composition as claimed in claim 1 wherein the photoextinction agent as the component (c) is selected from the class consisting of 4,4'-bis(p-dimethylaminophenylazo)diphenyl ether, 4,4'-bis(p-dimethylaminophenylazo)biphenyl, 4,4'-bis(p-diethylaminophenylazo)biphenyl and 4,4'-bis(p-dimethylaminophenylazo)-3,3'-dimethoxybiphenyl.

11. The photoresist composition as claimed in claim 1 wherein the aryl group represented by the symbol $R^6$ is a phenyl or naphthyl group.

12. The photoresist composition as claimed in claim 1 wherein the 2-arylethylenyl group represented by the symbol $R^6$ is a styryl group.

13. The photoresist composition as claimed in claim 1 wherein the phenylene group represented by the symbol A is a 1,4-phenylene or 1,3-phenylene group.

14. The photoresist composition as claimed in claim 1 wherein the fluorescent agent as the component (d) is selected from the class consisting of N,N′-dibenzylidene-1,4-phenylenediamine, N,N′-dibenzylidene-1,3-phenylenediamine, N,N′-bis(1-naphthylmethylene)-1,4-phenylenediamine, N,N′-bis(1-naphthylmethylene)-1,3-phenylenediamine, N,N′-dicinnamylidene-1,3-phenylenediamine and N,N′-bis(1-naphthylmethylene)-hydrazine.

15. The photoresist composition as claimed in claim 1 wherein the ratio of the amount of the photoextinction agent as the component (c) to the amount of the fluorescent agent as the component (D) is in the range fom 1:5 to 5:1 by weight.

* * * * *

UNITED STATES PATENT AND TRADEMARK OFFICE
CERTIFICATE OF CORRECTION

PATENT NO. : 4,268,603

DATED : May 19, 1981

INVENTOR(S) : TAKAYUKI SATO

It is certified that error appears in the above—identified patent and that said Letters Patent is hereby corrected as shown below:

Column 7,

Claim 1, at the end of line 7 of component (b), change "2,6-bis(4'-axidoben-" to -- 2,6-bis(4'-azidoben- --;

Claim 1, line 9 of component (b), change "axidobenzal)-" to -- azidobenzal)- --;

Claim 1, last line of component (c), change "n is a number of 0 to 1" to -- n is a number of 0 or 1 --;

Column 8,

Claim 9, at the end of line 3, delete "carbon atoms";

Column 10,

Claim 15, line 3, change "the component (D)" to -- the component (d) --.

Signed and Sealed this

Eighteenth Day of August 1981

[SEAL]

Attest:

GERALD J. MOSSINGHOFF

Attesting Officer        Commissioner of Patents and Trademarks